United States Patent [19]
Porter et al.

[11] Patent Number: 4,928,206
[45] Date of Patent: May 22, 1990

[54] FOLDABLE PRINTED CIRCUIT BOARD

[75] Inventors: Warren W. Porter, Escondido; Donald K. Lauffer, Poway, both of Calif.

[73] Assignee: NCR Corporation, Dayton, Ohio

[21] Appl. No.: 274,571

[22] Filed: Nov. 23, 1988

[51] Int. Cl.$^5$ .............................................. H05K 7/20
[52] U.S. Cl. ............................... 361/385; 165/104.33; 361/398; 439/77
[58] Field of Search ............................ 439/67, 77, 485; 363/141; 165/104.33, 80.4, 80.5, 185; 174/17 LF, 15.1; 357/82; 361/395, 385, 398, 413, 415

[56] References Cited

U.S. PATENT DOCUMENTS

| | | | |
|---|---|---|---|
| 2,984,773 | 5/1961 | Guldemond | 357/65 |
| 3,558,920 | 1/1971 | Giaever | 307/245 |
| 3,766,439 | 10/1973 | Isaacson | 317/100 |
| 3,858,090 | 12/1974 | Lehmann | 174/15.1 |
| 4,027,728 | 6/1977 | Kobayashi et al. | 165/105 |
| 4,149,219 | 4/1979 | Kraft | 361/386 |
| 4,399,501 | 8/1983 | Masselin | 363/141 |
| 4,412,272 | 10/1983 | Wedertz | 361/398 |
| 4,484,215 | 11/1984 | Pappas | 357/80 |
| 4,510,551 | 4/1985 | Brainard, II | 361/398 |
| 4,567,543 | 1/1986 | Miniet | 361/398 |
| 4,616,291 | 10/1986 | Sarnezki et al. | 361/398 |
| 4,677,528 | 6/1987 | Miniet | 361/398 |
| 4,689,721 | 8/1987 | Damerow et al. | 361/398 |
| 4,693,530 | 9/1987 | Stillie et al. | 439/67 |

OTHER PUBLICATIONS

IBM Tech. Discl. Bull., vol. 27, No. 9, Feb. 1985, p. 5286, "Block Cooling . . . Dissipation", Gruber et al.

*Primary Examiner*—Gerald P. Tolin
*Attorney, Agent, or Firm*—Wilbert Hawk, Jr.; Stephen F. Jewett; Jack R. Penrod

[57] ABSTRACT

A printed circuit board assembly is disclosed which includes a number of rigid printed circuit boards connected by a number of flexible printed circuit panels. Integrated circuits and similar components are mounted on the rigid printed circuit boards. The components are interconnected by printed circuit conductors of the rigid printed circuit boards and the flexible printed circuit panels. The resulting board assembly can provide a manifold increase in the usable component area over a single flat, rigid printed circuit board when it is folded and installed into a standard cylindrical, coolant filled container.

11 Claims, 5 Drawing Sheets

FOLDABLE PRINTED CIRCUIT BOARD

BACKGROUND OF THE INVENTION

The present invention relates to a printed circuit board, and more particularly to a flexible printed circuit board of a high speed computer system which may be folded in order to more efficiently fit within a fluid filled, cylindrical enclosure for cooling.

It is known in the art to mount discrete power semiconductors upon a generally cylindrical, rigid insulated mounting and to cool this combination by a metallic heat sink. It is also known to cool such heat sinks by forced convection, or a combination of convection and thermal conduction. An example of the later is shown in U.S. Pat. Ser. No. 2,984,773 issued May 16, 1961 to Guldemond et al. entitled "ALTERNATING CURRENT RECTIFYING ASSEMBLY". The problem with such devices is that these devices usually only mount components on an outer cylindrical surface because the mounting of components on the interior of the outer cylindrical surface is usually difficult. Thus, it is desirable to provide a printed circuit board for mounting in a generally cylindrical enclosure, which has components mounted on its outer cylindrical surface and also inside the outer cylindrical surface, yet which is easily manufactured.

Another known approach to mounting electrical and/or electronic circuits within a cylindrical enclosure is to put the components onto a flexible printed circuit "board" and then roll the flexible circuit into a spiral. Such an approach is shown in: U.S. Pat. Ser. No. 4,510,551 issued April 9, 1985 to Brainard II, entitled "PORTABLE MEMORY MODULE"; and U.S. Pat. Ser. No. 4,412,272 issued Oct. 25, 1983 to Wedertz et al., entitled "FLEXIBLE PRINTED CIRCUIT CARD ASSEMBLY".

The patent by Brainard II discloses a low power, air cooled, flexible memory module which is spirally wrapped around an inner cylindrical column in which the power source is mounted. Electrical insulation between the spiral layers is provided by a additional insulating sheet, or by the plastic integrated circuit packages acting as their own insulating spacers. In either case, the insulation and cooling characteristics would not be sufficiently defined to use such an approach for a fluid convection/conduction cooled, high speed computer system without a lot of trial and experimentation to get it right.

The patent of Wedertz et al. discloses a multi-layer flexible circuit board in which one of the external layers is a foam material. When the flexible circuit board is rolled into a spiral configuration, the foam separates and insulates the components from each other. To some extent, the foam also provides a type of conduction heat sink for the components. However, the heat sinking characteristics are inadequate for cooling some of the components. This is demonstrated by the alternative embodiment shown with cooling openings therein to provide cooling, and by the suggestion that high heat dissipating components be located near the edges to increase the cooling capacity. Such a design would not lend itself to a high speed, high heat dissipation computer system, which ideally has a freely flowing fluid for conduction/convection cooling of all the components regardless of where they are mounted.

It is an object of this invention to provide a printed circuit board assembly which has flexible panels such that the printed circuit board may be folded and inserted into a container whose dimensions would be too small to receive the printed circuit board assembly in the unfolded state.

It is another object of this invention to provide a printed circuit board assembly which may be folded and inserted into a container that is filled with a cryogenic coolant.

It is a further object of this invention to provide a printed circuit board assembly which may be folded into geometric configurations that permit the free flow of a cryogenic fluid coolant when the assembly is installed into a container.

It is a further object of this invention to provide a printed circuit board assembly which has flexible panels such that the printed circuit board may be folded and inserted into a container whose dimensions would be too small to receive the printed circuit board assembly in the unfolded state, and which has at least one connector between non-adjacent portions of the printed circuit board to reduce a signal path length of the assembly.

SUMMARY OF THE INVENTION

Briefly stated, in accordance with one aspect of the invention, the foregoing objects are achieved by providing a printed circuit apparatus for installation within a coolant filled container. The printed circuit apparatus includes two or more rigid printed circuit boards, and one or more flexible printed circuit panels. Each flexible printed circuit panel electrically connects a respective pair of the rigid printed circuit boards. To reduce the maximum transverse extent of the number of rigid circuit boards and the at least one flexible printed circuit panel to less than a maximum transverse extent of said container into which the apparatus is inserted, each flexible printed circuit panel is folded from a plane state.

The folded configuration may be in a fan-fold shape, a star shape, a spiral shape, or a closed polygon shape. Additionally, connections between nonadjacent edges of the rigid printed circuit boards may be bridged by connections and/or other rigid printed circuit boards therebetween. Each of the folded configurations allows the installation of the printed circuit assembly into a chamber of a vacuum insulated bottle into which it would not fit in the unfolded state. The chamber of the vacuum insulated bottle is for containment of a cryogenic fluid which is used as a coolant.

Various objects appear from a reading of the foregoing summary of the invention. Other objects and further scope of applicability of the present invention will appear from the following detailed description. It should be understood that the detailed description indicates one or more embodiments of the invention and are given by way of illustration only since changes and modifications may be made within the spirit and scope of the invention.

BRIEF DESCRIPTION OF THE DRAWINGS

While the specification concludes with the appended claims particularly pointing out and distinctly claiming the subject matter which is regarded as the invention, it is believed that the invention will be better understood from the following description of the illustrative embodiment taken in conjunction with the accompanying drawings, in which:

DETAILED DESCRIPTION OF THE PREFERRED EMBODIMENTS

Figure 1:
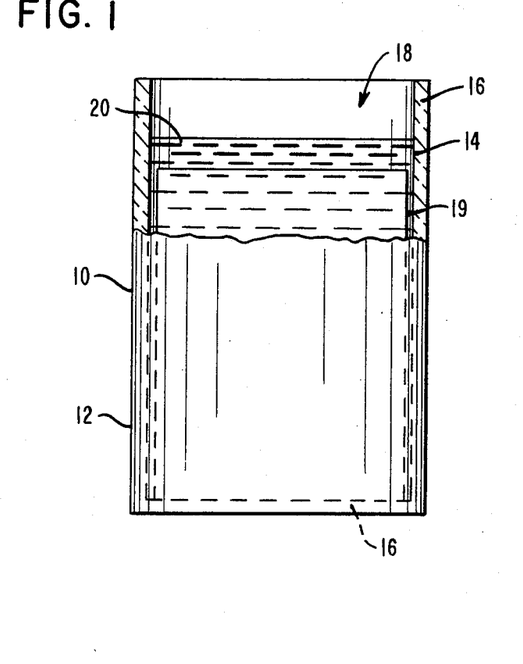
FIG. 1 is a partially cut away front view of a coolant filled, insulated container with a single rigid printed board immersed therein.

Shown in FIG. 1 is a standard insulated container 10, such a vacuum bottle or other vessel having an outer wall 12 and an inner wall 14 separated by an insulating region 16, which may be filled with a thermal insulating material or be evacuated, to reduce the heat transfer between walls 12 and 14. The inner wall 14 defines an inner chamber 18 which is usually cylindrical, but may have many other three dimensional shapes such as a parallelepiped. Located within the chamber 18 is a printed circuit board 19 and a fluid 20 which covers the board 19 and its components as a coolant. In the preferred embodiment, this fluid 20 is a cryogenic fluid such as liquid nitrogen or liquid helium.

Figure 2:
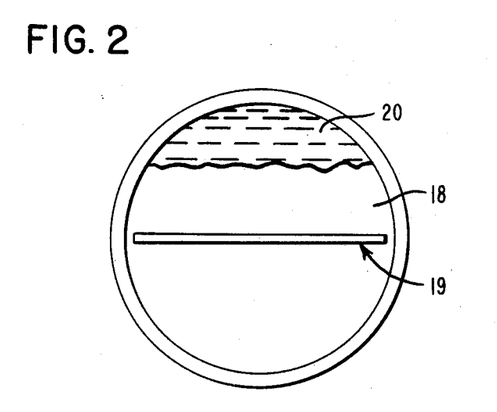
FIG. 2 is a top view of the container of FIG. 1.

FIG. 2 is a top view of container 10, and it shows that the standard, flat printed circuit board 19 occupies a relatively small percentage of the chamber 18. In other words, the fixed heat losses from the chamber 18 through the walls 12, 14; the insulating region 16; and through the top cover (not shown) are all incurred to cool the relatively small volume of the circuit board 19.

Figure 3:
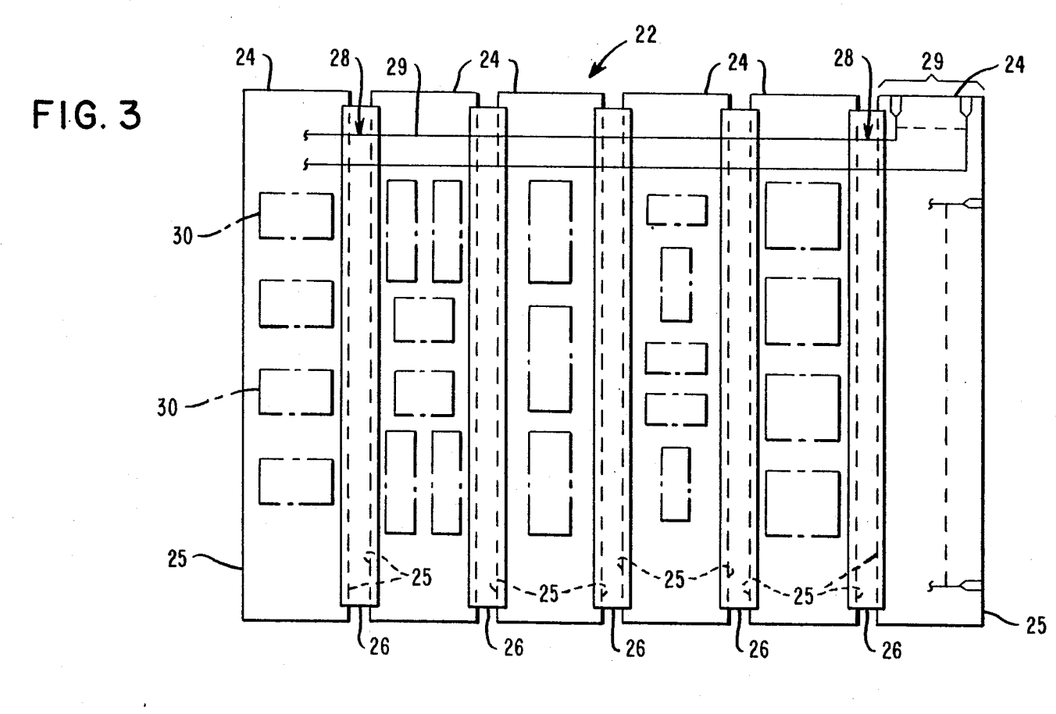
FIG. 3 is a front view of a printed circuit assembly according to the invention.

Referring now to FIG. 3, the preferred embodiment of the invention is seen. Instead of the single rigid circuit board 19 (see FIG. 1), the preferred embodiment has an articulated printed circuit board 22. The printed circuit board 22 is composed of a number of rigid printed circuit boards 24, which are fabricated using the known standard techniques for printed circuit board. Also, the width of each of the rigid printed circuit boards is less than the diameter of the inner chamber 18 of the container 10 (see FIG. 1). The rigid printed circuit boards 24 are joined along their respective edges 25 by flexible printed circuit panels 26. The flexible printed circuit panels 26 are made from a material such as polyimide or other similar plastics. The flexible printed circuit panels 26 have flexible printed circuit conductors 28, which may be etched and/or deposited according to known techniques. These flexible printed circuit conductors 28 electrically connect with printed circuit conductors 29 which may be etched and/or deposited on the rigid printed circuit boards 24 using known techniques. A number of components 30, such as integrated circuits, resistor networks, capacitor networks etc., are mounted on the rigid circuit boards 24 and are connected to the printed circuit conductors 29 using standard techniques. These components 30 on the rigid printed circuit boards 24 are then electrically interconnected by the flexible printed circuit conductors 28 of the flexible printed circuit panels 26 to form a high speed computer system board 22.

Figure 4:
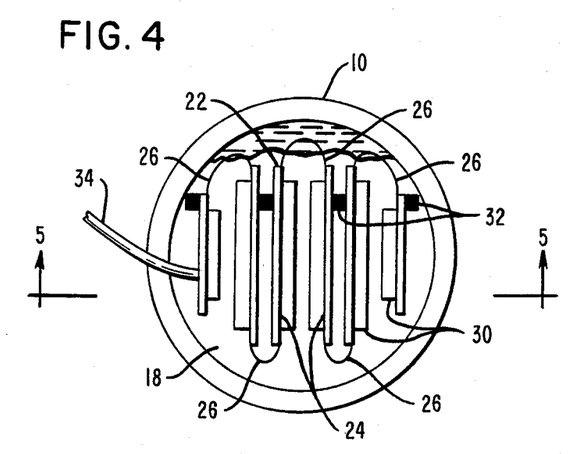
FIG. 4 is a top view of the printed circuit assembly shown in FIG. 4 after it has been folded and inserted into a coolant filled, insulated container.

Referring now to FIG. 4, the advantages gained by the preferred embodiment over the single rigid board approach shown in FIG. 2 are seen in this top view. By folding the articulated printed circuit board 22 along each flexible panel 26 in a fan-fold fashion, the printed circuit board 22, which has two to three times the effective board area as a single rigid board 19 (see FIG. 2), may easily be installed in the same size chamber 18 as required by the single rigid board 19. Thus, for the same size cryogenic container 10 and the same external surface area through which heat is absorbed from the external environment, the articulated printed circuit board 22, with rigid circuit boards 24 interconnected by the folded, flexible printed circuit panels 26, provides two to three times the usable circuit board area for mounting and connecting cryogenically cooled electronic components 30 as the single rigid board 19.

In order to keep the printed circuit board 22 folded in this configuration, a number of spacers 32 hold some of the edges 25 of the rigid printed circuit boards 24. The spacers 32 hold the board 22 in a folded position such that all of the components 30 may freely contact the surrounding cooling fluid 20. The spacers 32, when there is a need for more direct and/or additional interconnection conductors, may provide both a mechanical connection and an electrical connection between two rigid circuit boards 24.

Figure 5:
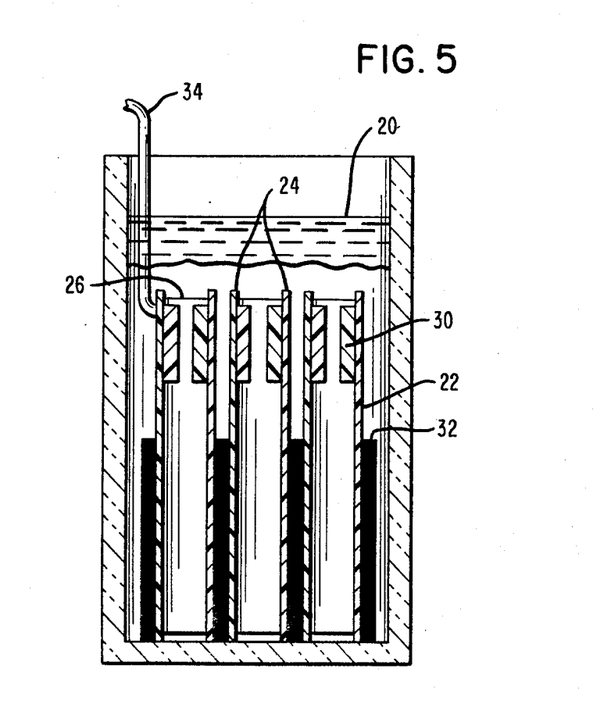
FIG. 5 is a partial section view taken along line 5—5 of FIG. 4.

Referring to FIG. 5, a section view of the preferred embodiment taken along line 5—5 of FIG. 4, is shown. It can be seen in FIG. 5 that the cooling fluid 20 may completely cover the circuit board 22 and partially cover an input/output cable 34.

Figure 6:
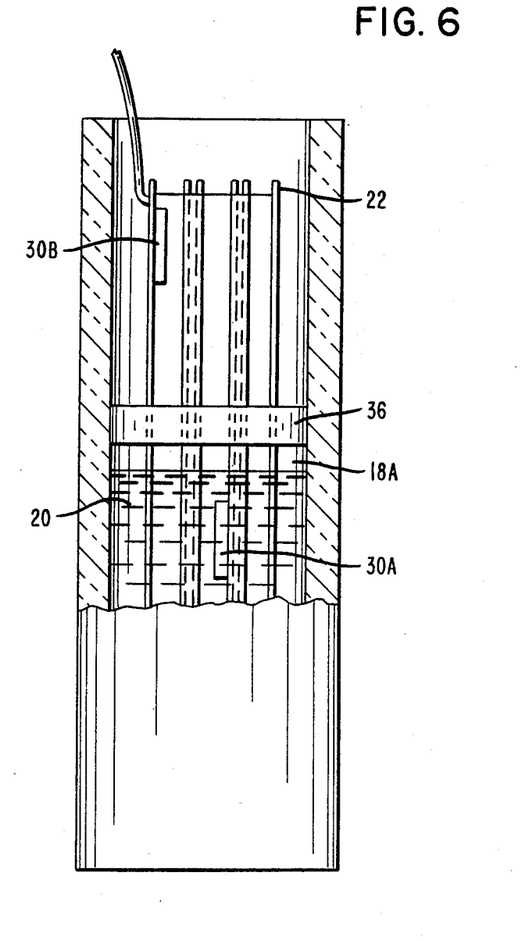
FIG. 6 is a partially broken away front view of another embodiment of the invention.

An alternative embodiment to the one shown in FIG. 5 is shown in FIG. 6. In the embodiment shown in FIG. 6, the components on the circuit board 22 are arranged such that there is a horizontal clearance band. All of the components that are to be cooled by the fluid 20 are mounted below this band. The circuit board 22 is then folded into a fan-fold configuration and held in that configuration by a slotted disk 36. The slotted disk 36, which may be fashioned in two or more mating pieces, holds the circuit board 22 in the region of the band. This slotted disk 36 functions as a heat insulating cover for the cooling fluid 20, as well as a mechanical connector between the rigid circuit boards 24. In this manner, components 30A that require cooling may be immersed within the cooling fluid 20 inside of an insulated and covered chamber 18A, and the components 30B that do not require such cooling can be kept above the cooling fluid 20. Yet, the two portions of the circuit board 22 may be interconnected by the conductors thereon (not shown in FIG. 6).

Figure 7:
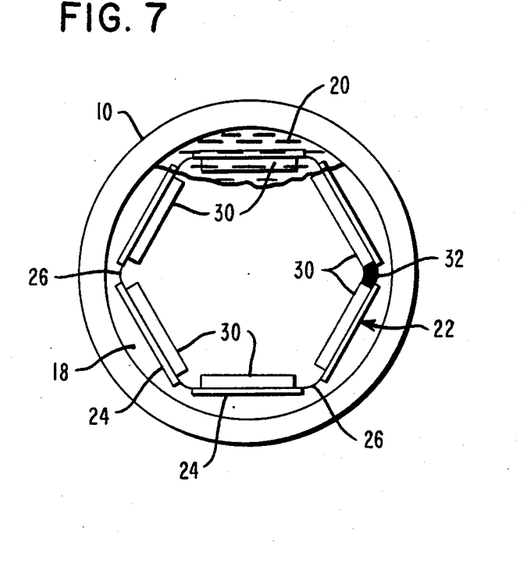
FIG. 7 shows a top view of a printed circuit assembly that has been folded into the shape of a right regular prism.

Referring now to FIG. 7, there is seen a top view of a further embodiment of the invention. In this further embodiment, the rigid printed circuit boards 24 all have substantially the same width, and the flexible printed circuit panels 26 are all bent to substantially the same angle; thereby, forming a configuration in substantially the exterior shape of a right regular prism. The two edges 25 which are not connected to one of the flexible printed circuit panels 26 may be mechanically and electrically connected by the spacer 32. The effective area of this configuration of the printed circuit board 22 has a total width which is approximately equal to the circumference of the cylindrical chamber 18. Thus, the effective area for mounting components 30 of the embodiment shown in FIG. 7 is also two to three times the area of the single rigid circuit board 19 (shown in FIG. 1). But, even with the increase in effective area, the right regular prism shaped embodiment has sufficient room for the cooling fluid 20 to surround and cool all of the components 30 on the printed circuit board 22.

Figure 8:
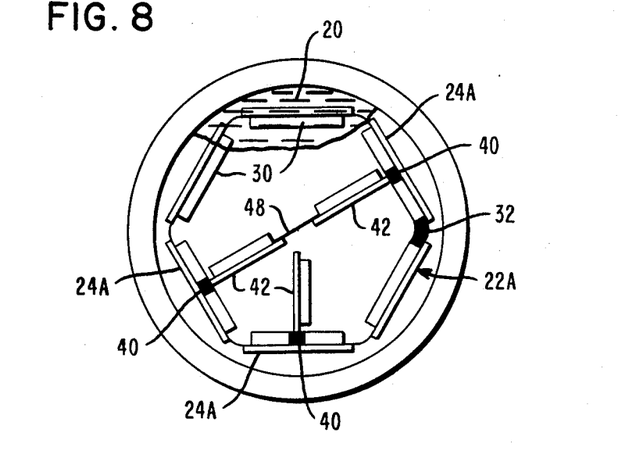
FIG. 8 shows a top view of a printed circuit assembly according to FIG. 7 with additional connector for the mounting of one or more boards internal to the right regular prism.

Referring now to FIG. 8, a top view of a modification of the right regular shaped embodiment is seen. This embodiment shows three surface mount connectors 40, which mount to connector pad regions provided on the rigid printed circuit boards 24A. Each of the connectors 40 connect the printed circuit board 22A to a radially inward projecting rigid printed circuit board 42. These radially projecting boards 42 increase the amount of effective circuit area for the components 30 beyond the factor of two to three realized by the previously described embodiments. In complex systems, two or more of the radially projecting printed circuit boards 42 may have flexible printed circuit panels 48. For some high speed computer circuits, there may be a need to keep transit delays to a minimum. In order to reduce transit delays, a shorter diagonal interconnect path between components may be formed by electrically connecting two radially projecting boards 42 with a flexible printed circuit panel 48. As can be seen in FIG. 8, the effective area of the printed circuit board 22A may be increased by adding other boards 42 and yet maintain the component spacing required for a free flow of the cooling fluid 20.

Thus, it will now be understood that there has been disclosed a foldable printed circuit board which provides a substantial increase in effective board area without requiring an increase in the size of the insulated container it is installed in. While the invention has been particularly illustrated and described with reference to a number of embodiments including the preferred embodiment thereof, it will be understood by those skilled in the art that various changes in form, details, and applications may be made therein, such as providing coaxial right regular prism configurations with one located inside the other. It is accordingly intended that the appended claims shall cover all such changes in form, details and applications which do not depart from the true spirit and scope of the invention.

What is claimed as new and desired to be secured by Letters Patent of the United States is:

1. A printed circuit apparatus including a container, comprising:
   a plurality of rigid printed circuit boards;
   a width of each of said plurality of rigid printed circuit boards is less than the maximum transverse extend of said container;
   at least two flexible printed circuit panels, each said flexible printed circuit panel is electrically connected to a respective pair of said plurality of rigid printed circuit boards;
   said flexible printed circuit panels are folded into alternately opening U-shapes such that said plurality of rigid printed circuit boards are joined in a fan-fold configuration within said container; and
   a cryogenic liquid filling a portion of said container and cryogenically cooling a portion of said plurality of rigid circuit boards and each said flexible circuit panel to provide cryogenic cooling to said portion.

2. The printed circuit apparatus according to claim 1, wherein said cryogenic liquid fills said container such that said plurality of rigid circuit boards and each said flexible circuit panel are completely covered.

3. The printed circuit apparatus according to claim 1, wherein a connector connects two adjoining rigid circuit boards along a pair of edges oppositely located to said U-shaped flexible printed circuit panel therebetween.

4. The printed circuit apparatus including a container, comprising:
   a plurality of rigid printed circuit boards;
   a width of each of said plurality of rigid printed circuit boards is less than half of said maximum transverse extent of said container;
   at least two flexible printed circuit panels, each said flexible printed circuit panel is electrically connected to a respective pair of said plurality of rigid printed circuit boards;
   each said flexible printed circuit panel is folded into an angle of less than one hundred eighty degrees such that said plurality of rigid printed circuit boards are jointed in a prismatic configuration within said container; and
   a cryogenic fluid filling a portion of said container and cryogenically cooling a portion of said plurality of rigid circuit boards and each said flexible circuit panel.

5. The printed circuit apparatus according to claim 4, wherein said cryogenic fluid fills said container such that said plurality of rigid circuit boards and each said flexible circuit panel are completely covered.

6. A printed circuit apparatus including a container, comprising:
   a plurality of rigid printed circuit boards;
   each of said plurality of rigid printed circuit boards has a width which is equivalent to that of any other of said plurality of rigid printed circuit boards;
   said width being less than half of the maximum transverse extent of said container;
   at least two flexible printed circuit panels, each said flexible printed circuit panel is electrically connected to a respective pair of said plurality of rigid printed circuit boards; and
   each flexible printed circuit panel is folded to equivalent angles and said equivalent angles being less than one hundred eighty degrees such that the rigid printed circuit boards are jointed in a regular prismatic configuration within said container.

7. The printed circuit apparatus according to claim 6, wherein said container contains a cryogenic fluid said plurality of rigid circuit boards as a coolant cover.

8. The printed circuit apparatus according to claim 6, wherein said container has a cryogenic fluid as a coolant covering a portion of said plurality of rigid circuit boards, and a remaining portion of said plurality of rigid circuit boards that is located inside said container and outside of said cryogenic fluid.

9. The printed circuit apparatus according to claim 6, wherein a connector connects one of said plurality of rigid circuit boards joined in said regular prismatic configuration and an edge of an additional rigid printed circuit board which is located within the ambit of said regular prismatic configuration.

10. An apparatus including a substantially cylindrical container, comprising:
    a first rigid printed circuit board having a height and a width less than the respective height and the diameter of said substantially cylindrical container located within said substantially cylindrical container;

a second rigid printed circuit board having a height and a width less than the respective height and diameter of said substantially cylindrical container, located in a spaced relationship from said first rigid circuit board within said substantially cylindrical container;

a flexible printed circuit electrically connecting said first and second rigid printed circuit boards, said flexible printed circuit being folded into a V-shape such that said first and second rigid circuit boards are in an angular relationship; and a cryogenic liquid contained within said substantially cylindrical container covering said first and second rigid circuit boards, and said flexible printed circuit.

11. An apparatus including a substantially cylindrical container, comprising:

a first rigid printed circuit board, having a height and a width less than the respective height and the diameter of said substantially cylindrical container, located within said substantially cylindrical container;

a second rigid printed circuit board, having a height less and a width less than the respective height and diameter of said substantially cylindrical container, located in a angular relationship with said first rigid circuit board within said substantially cylindrical container;

a third rigid printed circuit board, having a height less and a width less than the respective height and diameter of said substantially cylindrical container, located in a angular relationship with said first and second rigid circuit boards within said substantially cylindrical container;

a first flexible printed circuit electrically connecting said first and second rigid printed circuit boards;

a second flexible printed circuit electrically connecting said second and third rigid printed circuit boards; and a connector connecting said rigid printed circuit boards in a right regular prismatic configuration.

* * * * *

UNITED STATES PATENT AND TRADEMARK OFFICE
CERTIFICATE OF CORRECTION

PATENT NO. : 4,928,206

DATED : May 22, 1990

INVENTOR(S) : Warren W. Porter et al.

It is certified that error appears in the above-identified patent and that said Letters Patent is hereby corrected as shown below:

Column 5, line 55, "extend" should be --extent--.

Column 6, line 23, "jointed" should be --joined--.

Column 6, line 48, "jointed" should be --joined--.

Signed and Sealed this

Thirtieth Day of July, 1991

Attest:

*Attesting Officer*

HARRY F. MANBECK, JR.

*Commissioner of Patents and Trademarks*